Figure 1:
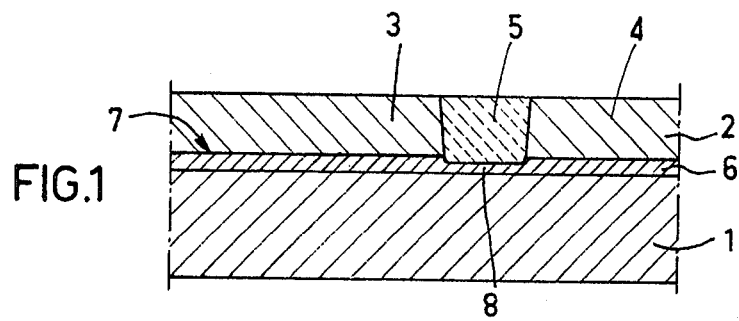

United States Patent [19]

deBrebisson

[11] 4,113,513
[45] Sep. 12, 1978

[54] METHOD OF MANUFACTURING A SEMICONDUCTOR DEVICE BY NON-SELECTIVELY IMPLANTING A ZONE OF PRE-DETERMINED LOW RESISTIVITY

[75] Inventor: Michel deBrebisson, Caen, France

[73] Assignee: U.S. Philips Corporation, New York, N.Y.

[21] Appl. No.: 764,587

[22] Filed: Feb. 1, 1977

[30] Foreign Application Priority Data

Feb. 16, 1976 [FR] France .................................. 76 04169

[51] Int. Cl.² .......................................... H01L 21/265
[52] U.S. Cl. .................................... 148/1.5; 148/175; 357/50; 357/91
[58] Field of Search ............................ 357/52, 50, 91; 148/175, 1.5

[56] References Cited

U.S. PATENT DOCUMENTS

| | | | |
|---|---|---|---|
| 3,386,865 | 6/1968 | Doo ....................................... | 148/175 |
| 3,748,187 | 1/1973 | Aubuchon et al. ................... | 148/1.5 |
| 3,891,469 | 6/1975 | Moriyama ............................. | 148/1.5 |
| 4,011,105 | 3/1977 | Paivinen .............................. | 148/1.5 |
| 4,011,581 | 3/1977 | Kubo et al. .......................... | 357/52 |
| 4,023,195 | 5/1977 | Richman .............................. | 357/23 |

Primary Examiner—R. Dean
Assistant Examiner—Upendra Roy
Attorney, Agent, or Firm—Frank R. Trifari; Steven R. Biren

[57] ABSTRACT

A method of manufacturing a semiconductor device is disclosed in which an unwanted inversion layer between two otherwise isolated regions is eliminated. The inversion layer is eliminated by ion implanting a semiconductor layer of higher doping concentration than that of the substrate over the entire substrate surface. A semiconductor device manufactured by the method is also disclosed.

7 Claims, 13 Drawing Figures

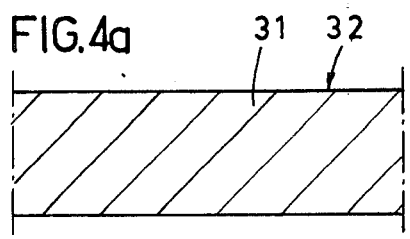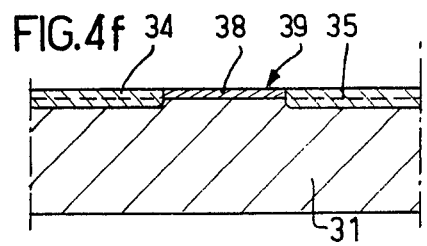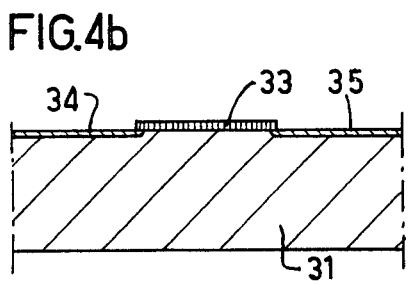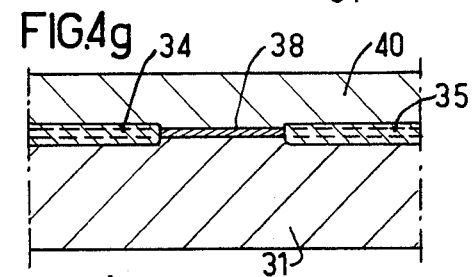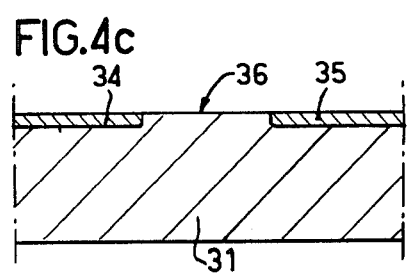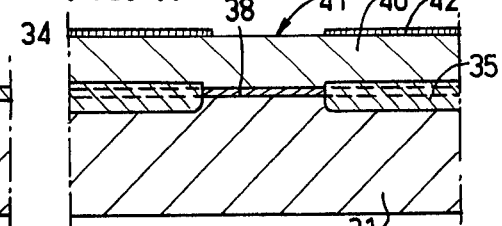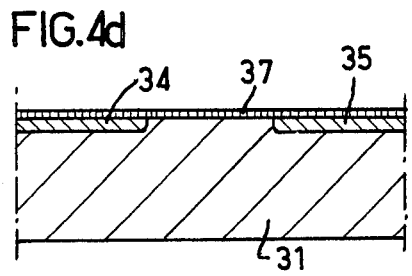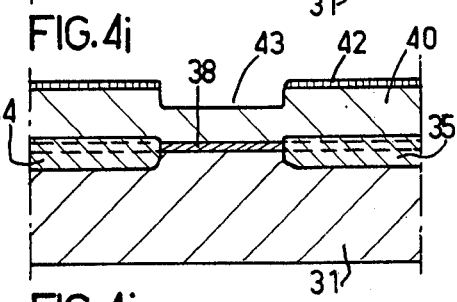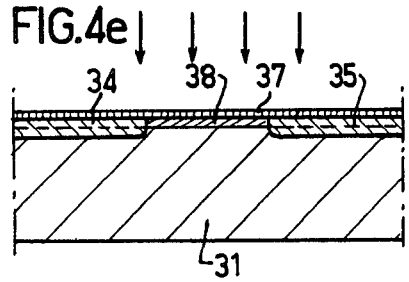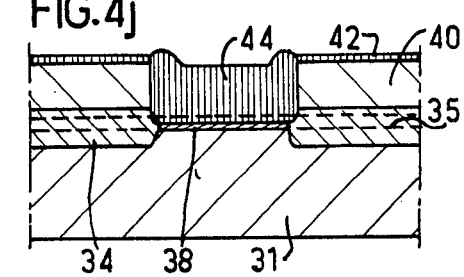

METHOD OF MANUFACTURING A SEMICONDUCTOR DEVICE BY NON-SELECTIVELY IMPLANTING A ZONE OF PRE-DETERMINED LOW RESISTIVITY

The invention relates to a method of manufacturing a semiconductor device in which a semiconductor layer is provided on a substrate region of a first conductivity type by epitaxial growth, after which locally a zone of electrically insulating material is provided, which zone expands from the surface of the layer throughout the thickness of the epitaxial layer and electrically insulates from each other two regions of the second conductivity type situated on either side of the insulating zone.

The invention furthermore relates to a semiconductor device manufactured by using the method.

Integrated semiconductor devices are known comprising a body of semiconductor material of a first conductivity type covered by an epitaxial layer, circuit elements of the integrated circuit in said body being separated from each other by zones of insulating material, usually of a semiconductor oxide, for example, silicon oxide ($SiO_2$).

It is known that when such an insulating material is in contact with a semiconductor material an inversion layer (in the case of p-type material) or an enhancement layer (in the case of n-type material) is formed at the surface of the semiconductor material. Such a layer, whose thickness is very small, is caused by storage of charge in the dielectric material, the charge being due to defects and to ions present in the material. This is the case, for example, with the n-type inversion layer which is formed in p-conductive silicon which is in contact with silicon oxide. When the zone of insulating material is used for insulating from each other two regions of which the conductivity type is opposite to that of the underlying body, the inversion layer forms a channel which reduces the insulation qualities and which may even give rise to an actual short-circuit.

In order to avoid this drawback it is known to diffuse doping elements determining the conductivity type which is opposite to that of the inversion layer, but it is difficult to restrict the diffusion to the channel zone and to avoid that, in the case of, for example, a substrate covered by an epitaxial layer, the epitaxial layer experiences the detrimental influence of the diffused doping elements.

It has also been suggested to locally introduce doping elements prior to the formation of an epitaxial layer, the doping elements being diffused during the formation of the insulating zone which usually takes place by thermal oxidation. The drawback of this solution, however, is that a mask is indispensable for localizing the doping, while another drawback is that the solution is restricted to the case in which the realization of the insulating zone comprises a thermal treatment at a sufficiently high temperature and for a sufficiently long period of time. The use of the solution is difficult in the case of the realization of an insulating zone at low temperature, for example, by oxidation under pressure.

It is a particular object of the invention to avoid the drawbacks of the known method and the invention provides a method by which it is possible to eliminate the current channel which is caused by the inversion layer formed between a semiconductor material and an insulating layer, in which the channel may cause a short-circuit between regions which are to be insulated from each other.

A method in accordance with the invention is characterized in that a surface layer of the first conductivity type and having a higher doping concentration than that of the substrate region is provided over the entire surface of the substrate region by ion implantation, the epitaxial layer is then grown, and the insulating zone is then provided over such a depth that it adjoins the surface layer but does not traverse it.

It is to be noted that in this application reference to ion implantation is to be understood to include also the usually subsequent annealing treatment.

The inversion layer caused in the body and situated at the edge of the zone of insulating material is eliminated by the compensation obtained by the implanted doping ions. The implantation requires no thermal diffusion over a long period of time and/or with very high temperature. The risk of disturbance of the epitaxial layer is substantially eliminated and the method is compatible with oxidation methods performed at low temperature.

The implantation is carried out throughout the flat surface on the body used as a substrate and it is hence not necessary to use a localizing mask.

In certain cases the conductivity type of the epitaxial layer is opposite to the conductivity type of the body, while the regions separated from each other by the insulating zone are formed by parts of the epitaxial layer. In most of the cases the regions separated from each other by the insulating layer are formed from strongly doped surface regions which, prior to the provision of the epitaxial layer, adjoin the surface of the body. Said surface regions of the second conductivity type can be clearly distinguished from deep, usually coplanar, strongly doped regions which partly penetrate into the body and partly into the epitaxial layer. In all cases the concentration of the implanted doping ions is much smaller than that of the regions so as not to invert the conductivity type in the part of the regions which is situated at the interface between the body and the epitaxial layer.

According to a preferred embodiment of the method according to the invention the implantation occurs via a thin layer which passes the ions and which is previously provided on the flat surface of the semiconductor body and is removed after the implantation and prior to the provision of the epitaxial layer. By implanting doping elements via a thin layer which passes the ions and which is removed afterwards, it is possible to eliminate surface defects and to provide the implanted doping elements only over the strictly necessary thickness and in the strictly necessary concentration; the subsequently performed epitaxial growth necessitates the use of the lowest possible doping concentration. When silicon is used, the thin ion-passing layer is preferably manufactured from silicon oxide.

The invention also relates to a device manufactured according to the above-described method and which is characterized in that the device comprises a substrate which, below its interface with an epitaxial layer, has a thin implanted layer of the same conductivity type as the substrate, at least a zone of insulating material extending from the surface of the device down to the said implanted layer and insulating two substantially coplanar strongly doped regions in which the conductivity type is opposite to that of the substrate.

The invention may be used for the manufacture of integrated circuits, in particular when the manufacture of the device includes no thermal treatment of a long duration and at high temperature after the formation of the epitaxial layer on the active surface of the device.

Figure 2:
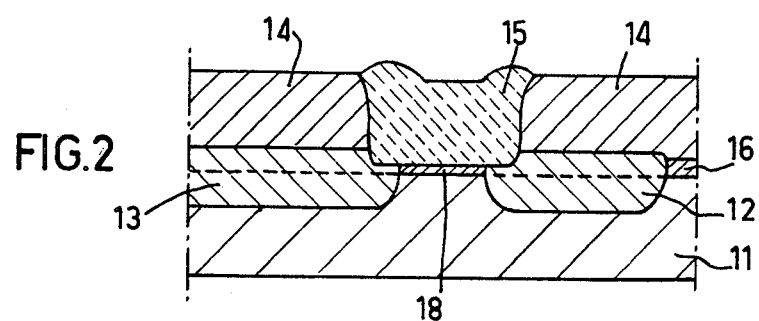
Figure 3:
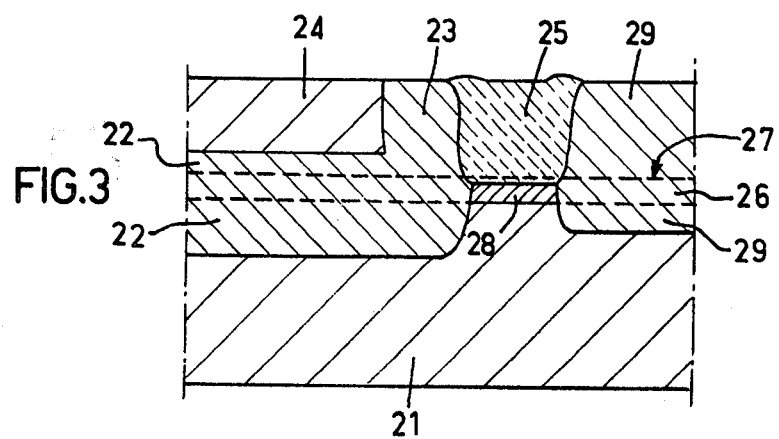

The invention will now be described in greater detail, by way of example, with reference to the accompanying drawing, in which:

FIG. 1 is a diagrammatical sectional view of a part of a semiconductor device manufactured by means of a method according to the invention, FIG. 2 is a diagrammatic sectional view of a part of a further semiconductor device manufactured by means of a method according to the invention, FIG. 3 is a diagrammatic sectional view of a part of a third semiconductor device manufactured by means of a method according to the invention, FIGS. 4a to 4j are diagrammatic sectional views in various stages of manufacture of a semiconductor device obtained by using the method according to the invention.

All the figures are diagrammatic and the dimensions are not drawn to scale, in particular with respect to the thickness dimension, so as to clarify the drawing.

The device shown in FIG. 1 comprises a substrate 1 of a first conductivity type. The substrate 1 has a layer 2 which is provided by epitaxial growth and the conductivity type of which is opposite to that of the substrate. The layer 2 has separate regions 3, 4 which are insulated from each other by zones 5 of insulating material which extends down to the substrate 1. In the proximity of the surface 7 of the substrate 1 a thin layer 6 was provided by ion implantation over the entire surface 7 and the impurity concentration of which is stronger than that of the substrate which in this stage is not yet covered by the layer 2, the ions being of the type used for causing the first conductivity type. The part 8 of the implanted thin layer 6 situated below the insulating layer 5 eliminates the risk of an insulation defect which might be caused by an inversion layer in the substrate 1 along the junction with the insulating material of the zone 5.

The device shown in FIG. 2 comprises a silicon substrate 11 in which two substantially coplanar, strongly doped regions 12 and 13 are formed the conductivity type which is opposite to that of the substrate 11. The substrate has a surface layer 16 of the same conductivity type obtained via implantation. The layer 16 is formed over the entire surface of the substrate via implantation, while after said operation an epitaxial layer 14 is grown, after which, in a direction at right angles to the part 18 of the layer 16 situated between the regions 12 and 13, the layer 14 is etched away and a localized oxidation is carried out until the insulating zone 15 thus formed extends substantially down to the surface layer 16.

The inversion layer which would otherwise be caused in the substrate by the insulating zone 15 is eliminated by the ions implanted at 18, so that the short-circuit which said inversion layer would give rise is prevented. Since the regions 12 and 13 are strongly doped, the doping concentration of the implanted layer is insufficient to invert the conductivity type in said regions, the doping concentration of the implanted zone being $10^3$ to $10^5$ times smaller than that of said regions; however, the concentration is larger than the doping concentration of the semiconductor body, for example 10 to 100 times larger.

The device shown in FIG. 3 comprises a silicon substrate 21 in which a strongly doped region 22 is formed, the conductivity type of which is opposite to that of the substrate. A layer 26 of the same conductivity type as the substrate is implanted at the surface in the said substrate over the entire surface 27, while after the implantation an epitaxial layer 24 is formed and then, via a series of masking, diffusion and oxidation treatments, an insulating zone 25, a diffused zone 23 for contacting the region 22, and a zone 29 (which is provided simultaneously with the zone 23 via diffusion) are formed.

The inversion layer which would otherwise be caused in the substrate by the insulating layer 25 is eliminated by the ions implanted in the part 28 of the layer 26. The region 22 and the zones 23, 29 are sufficiently strongly doped to prevent the implanted ions of the layer 26 from inverting the conductivity type of the said region 22 and the said zones 23, 29.

An embodiment of the manufacture of a semiconductor device by means of a method according to the invention will now be described.

Starting material is a body 31 of weakly doped silicon of p-conductivity type, in which the doping concentration is, for example, $10^{15}$ atoms/cm$^3$ (FIG. 4a). On a large surface 32 of the body 31 an oxide mask 33 is formed via oxidation and photoetching (FIG. 4b), while doping material is deposited via the windows present in the said mask, and a prediffusion is carried out of surfaces 34 and 35 of n-conductivity type which are to form strongly doped buried regions, the ultimate doping concentration in the said region being, for example $10^{21}$ arsenic atoms/cm$^3$ or $5.10^{19}$ antimony atoms/cm$^3$.

The oxide mask 33 is then removed by a suitable etching treatment (FIG. 4c), while an oxide layer 37 is grown on the thus obtained free surface 36 (FIG. 4d) in a thickness of approximately 0.02 micron, the said layer 37 being formed by a thermal oxidation treatment of 1000° C. for 10 minutes in a dry oxygen atmosphere.

An implantation of boron ions through the oxide layer 37 is then carried out throughout the relevant surface of the body 31 with an energy of 120 to 180 KeV and a radiation dose of $10^{11}$ to $10^{13}$ ions per cm$^2$. In this manner an implanted layer 38 is obtained (FIG. 4e) which, after an annealing treatment at 900° C. for 15 minutes, has a thickness of 0.6 micron and a maximum concentration of $5.10^{16}$ to $10^{17}$ atoms per cm$^3$.

The next operation is the removal of the oxide layer 37 (FIG. 4f), for example, by a suitable etching treatment in an etching bath on the basis of hydrofluoric acid and ammonium fluoride. The surface 39 exposed in this manner is prepared for an epitaxial growth process, and a layer 40 of n or p-conductivity type is provided on said surface 39 epitaxially from the gaseous phase (FIG. 4g). The layer 40 is doped, for example, with arsenic to obtain a concentration of $2.10^{15}$ to $10^{16}$ arsenic atoms per cm$^3$ so that the n-conductivity type and a resistivity of 0.5 ohm.cm to 2 ohm.cm are obtained. The thickness of the said layer 40 is 0.8 to 1.6 microns, and is, for example, equal to 1 micron.

A mask 42 is then provided on the surface of the layer 40, for example, a mask of thermal oxide with a thickness of 0.02 to 0.03 micron on which a silicon nitride layer is provided whose thickness is 0.07 to 0.10 micron (FIG. 4h). Said mask comprises at least one window 41 which is situated directly above the partial layer 38 between the buried regions 34 and 35 and which is destined to form an insulating zone between two parts of the epitaxial layer 40. Via the window 41 of the mask 42 the silicon of the layer 40 is then etched so as to form in this manner a cavity 43 (FIG. 4a) whose depth is such that after the subsequent oxidation treatment the oxide solid product was sampled by digging into the mass with a spatula. One hundred grams were tested by leaching according to the procedure set out in Part A except that 200 ml. aliquots of distilled water were used for the leaching test. An abbreviated Table of test results is shown below:

| Leach Sequence | Leach Portion Volume (ml.) | Mercury Content (ppm) of Leach Portion |
| --- | --- | --- |
| 1 | 200 | 0.0084 |
| 4 | 200 | 0.002 |
| 29 | 200 | 0.003 |
| 44 | 200 | 0.001 |
| 55 | 200 | 0.002 |

PART E

Leaching of Untreated Arsenic Containing Sludge

The method and apparatus of Part A were employed in this experiment. The sludge waste was an acidic material resulting from thermal process phosphoric acid manufacture. The sludge contained 40 weight percent solids with 1500 ppm and 500 ppm respectively of arsenic in the solid and liquid phases. The predominant part of the arsenic was present as arsenic sulfide.

One hundred grams of the sludge were subjected to sequential leaching. The results of the leaching are as follows:

| ARSENIC CONCENTRATION IN SLUDGE LEACHATE FRACTIONS | | |
| --- | --- | --- |
| Leach Sequence | Leach Portion Volume (ml.) | Arsenic Content (ppm) of Leach Portion |
| 1 | 100 | 444 |
| 2 | 100 | 84.5 |
| 3 | 100 | 58.3 |
| 4 | 100 | 39.4 |
| 5 | 100 | 28.0 |
| 6 | 100 | 33.6 |
| 7 | 100 | 30.8 |
| 8 | 100 | 38.8 |
| Etc. | After 1000 | 6.8 |
| Etc. | After 2000 | 17 |
| Etc. | After 3000 | 5.2 |
| Etc. | After 4000 | 5.2 |
| Etc. | After 5000 | 10.2 |
| Etc. | After 6000 | 2.2 |
| Etc. | After 7000 | 4.6 |
| Etc. | After 8000 | 2.6 |

PART F

Fixation of Arsenic in Arsenic Containing Sludge Waste

Two hundred grams of the arsenic containing sludge used in Part E were treated by first mixing with 20 grams of lime (resultant pH 11), then the mixing was continued with addition of 20 grams of vermiculite and 20 grams of cement. The mixture had the appearance of a paste without a separate liquid phase. After standing for 3 days, the mixture had a dry hard appearance. A core sample of the hardened mixture was obtained by driving a tube into the mass. One hundred grams of the core sample were tested by the method described in Part A. The results of the leaching test are as follows:

| Leach Sequence | Leach Portion Volume (ml.) | Arsenic Content (ppm) of Leach Portion |
| --- | --- | --- |
| 1 | 100 | 8.5 |
| 2 | 100 | 0.05* |
| 3 | 100 | 0.05* |
| 4 | 100 | 0.22 |
| 5 | 100 | 0.39 |
| 6 | 100 | 0.05* |
| 7 | 100 | 0.16 |
| 8 | 100 | 0.05* |

*limit of detection

PART G

Fixation of Arsenic and Mercury in Combined Sludge Waste

Two hundred grams of mixed sludge were prepared by mixing one part by weight of the mercury containing sludge described in Part B with one part by weight of the arsenic sludge described in Part D. Two hundred grams of the mixed sludge were mixed with 5 grams of vermiculite and 30 grams of cement. The mixture was mixed to a uniform paste without the appearance of a liquid phase. It was noted that some of the vermiculite migrated to the top of the mixture. The mixture had a pH of 6. Ten grams of lime were added to give a pH of 11. The mixture was allowed to set for 6 days. One hundred grams of a core sample were tested by the method of Part A. One hundred ml. aliquots of leach solution were passed through the sludge. The results are shown below:

| Leach Solution | Leach Portion (volume ml.) | Heavy Metal Content (ppm) of Leachate | |
| --- | --- | --- | --- |
| | | Hg | As |
| | 100 | 0.011 | 0.97 |
| 2 | 100 | 0.003 | 0.25 |

While the invention has been described with reference to specific embodiments, it will be understood that modifications of the invention may be made without departing from the invention as described in the following claims.

What is claimed:

1. A method of treating heavy metal containing sludge waste to produce a cementitious solid product having reduced heavy metal leachability by mechanically mixing said waste with fixing ingredients comprising vermiculite and cement, said waste and fixing ingredients being mixed in a proportion effective to set as a cementitious solid product.

2. The method of claim 1 wherein the heavy metal content of the sludge waste comprises mercury or arsenic.

3. The method of claim 1 wherein the sludge waste originates from mercury cathode brine electrolysis cell operation.

4. The method of claim 1 wherein the cement is Portland cement.

5. The method of claim 1 wherein the weight ratio of vermiculite to cement is from about 5:1 to about 1:5.

6. The method of claim 1 wherein the solids content of the sludge waste is from about 40 to about 70 weight percent based on the weight of the sludge waste.

7. The method of claim 1 wherein sludge waste is mixed with cement ingredient in proportion such that the weight ratio of the aqueous liquid phase of the sludge to cement is in the range from 10:1 to 1:3.

* * * * *